United States Patent [19]
Galton

[11] Patent Number: 5,369,404
[45] Date of Patent: Nov. 29, 1994

[54] COMBINED ANGLE DEMODULATOR AND DIGITIZER

[75] Inventor: Ian Galton, Irvine, Calif.

[73] Assignee: The Regents of the University of California, Oakland, Calif.

[21] Appl. No.: 56,268

[22] Filed: Apr. 30, 1993

[51] Int. Cl.⁵ .............................................. H03M 3/02
[52] U.S. Cl. .................................................... 341/143
[58] Field of Search ......................... 341/143, 155, 172; 375/29, 33

[56] References Cited

U.S. PATENT DOCUMENTS 5,030,954  7/1991  Ribner .................................. 341/172
5,055,843 10/1991  Ferguson ............................ 341/143

OTHER PUBLICATIONS

R. Douglas Beards et al., "An Oversampling Delta-Sigma Frequency Discriminator," Jan. 1994, IEEE Transactions on Circuits and Systems.

*Primary Examiner*—Brian K. Young
*Attorney, Agent, or Firm*—Daniel L. Dawes

[57] ABSTRACT

A new technology for simultaneously performing the previously separate functions of analog phase-tracking and A/D conversion, represented by a family of systems referred to as delta-sigma frequency-to-digital converters ($\Delta\Sigma$FDCs). Each system uses coarse analog phase measurements, quantization noise shaping, and decimation filtering to perform instantaneous frequency-to-digital conversion. Because they operate on instantaneous frequency in the manner that $\Delta\Sigma$ modulators operate on amplitude, they share many of the benefits enjoyed by $\Delta\Sigma$ modulator-based A/D converters such as reduced analog circuit requirements and amenability to VLSI implementation.

22 Claims, 7 Drawing Sheets

COMBINED ANGLE DEMODULATOR AND DIGITIZER

FIELD OF THE INVENTION

The invention relates to analog-to-digital (A/D) converters and phase-tracking devices, specifically a device that performs both functions simultaneously.

BACKGROUND OF THE INVENTION

Phase-locked loops are used in a multitude of communications and instrumentation applications performing phase-tracking operations such as phase-coherent demodulation, carrier tracking, timing recovery, bit synchronization, and Doppler measurement. Because of the trend toward digital signal processing, it is increasingly necessary to perform analog-to-digital conversion in addition to phase-tracking. Usually, this is done by combining traditional A/D converters with either analog or digital phase-locked loops. The drawback is that relatively precise analog circuitry is required for even moderate levels of digital conversion accuracy. The current invention employs a novel technique for simultaneously performing phase-tracking and A/D conversion with the goals of reducing analog circuit complexity and sensitivity to non-ideal component behavior. Theoretical and computer simulation results indicate that systems based on the technique can be developed that have comparable performance to the traditional approach with significantly less complex and precise analog circuitry.

The technique gives rise to a family of systems that will be referred to as delta-sigma frequency-to-digital converters (ΔΣFDCs). Like a phase-locked loop, each ΔΣFDC tracks the phase and frequency of its input signal. However, unlike a phase-locked loop, it performs coarse analog phase measurements using a one-bit A/D converter (i.e., a hard limiter) sampled at many times the Nyquist rate of the signal bandwidth, and employs quantization noise shaping and decimation filtering to obtain an accurate digital estimate of the instantaneous frequency of its input. Accordingly, ΔΣFDCs operate on instantaneous frequency in a similar manner to the way delta-sigma (ΔΣ) modulator-based A/D converters operate on amplitude. Hence, they share many of the benefits enjoyed by ΔΣ modulator-based A/D converters such as reduced analog circuit requirements and amenability to very large scale integration (VLSI) implementation.

SUMMARY OF INVENTION

The invention is a new technology for simultaneously performing the previously separate functions of analog phase-tracking and A/D conversion. The advantage over the traditional approach of performing the functions separately is significantly reduced analog circuit complexity and cost. The invention is represented by a family of systems referred to as delta-sigma frequency-to-digital converters (ΔΣFDCs). Each system uses coarse analog phase measurements, quantization noise shaping, and decimation filtering to perform instantaneous frequency-to-digital conversion. Because they operate on instantaneous frequency in a similar manner to the way that ΔΣ modulators operate on amplitude, they share many of the benefits enjoyed by ΔΣ modulator-based A/D converters such as reduced analog circuit requirements and amenability to VLSI implementation.

Phase-tracking problems are ubiquitous in communications and instrumentation applications, and the trend toward digital signal processing fueled by advances in modern VLSI processes is rapidly necessitating the juxtaposition of phase-tracking and A/D conversion functions in many applications. Just as ΔΣ modulation made possible the development of extremely accurate monolithic A/D converters without trimmed components, it is likely that the current technique will give rise to high precision monolithic frequency-to-digital converters that are similarly robust. The ΔΣFDC could become an important building block for modern, integrated receivers in communications and instrumentation.

The invention is pointed out with particularity in the appended claims. The above and further objects, features and advantages of the invention may be better understood by referring to the following detailed description, which should be read in conjunction with the accompanying drawings.

DETAILED DESCRIPTION OF PREFERRED EMBODIMENTS

A variety of structures based on the idea can be found each representing performance tradeoffs. Certain of the structures are described in this section to illustrate different aspects of the underlying principle. A heuristic explanation of their operation is provided along with theoretical results and computer simulations.

In the following, it will be assumed that each ΔΣFDC operates on a signal of the form:

$$x_r(t) = A\cos\left(2\pi f_c t + 2\pi \int_{-\infty}^{t} \phi(\tau)d\tau\right) + n(t),$$

where A is a constant amplitude, $f_c$ is a constant carrier frequency, $\phi(t)$ is a frequency modulation signal with bandwidth $B<<f_c$, and $n(t)$ is an undesired noise term that will be referred to as channel noise. The purpose of each of the $\Delta\Sigma$FDCs presented below is to produce an accurate digitized estimate of $\phi(t)$.

The high level anatomy of a $\Delta\Sigma$FDC is similar to that of a $\Delta\Sigma$ modulator-based A/D converter in that it comprises a modulator loop and a lowpass decimation filter. The modulator loop operates on the input signal, $x_r(t)$, and produces a coarsely quantized sequence at a sample rate many times the Nyquist rate of $\phi(t)$. As discussed below, the output can be considered the sum of three components: a component corresponding to $\phi(t)$, a component corresponding to $n(t)$, and a component corresponding to quantization error. The component corresponding to $\phi(t)$ is restricted to a low frequency portion of the spectrum because of the high sampling rate. As will be shown, the modulator loop shapes the spectra of the other components so that most of their power resides at high frequencies. The decimation filter functions as a lowpass digital filter of bandwidth B followed by a decimator. The purpose of the lowpass filtering is to preserve the component corresponding to $\phi(t)$ while removing the out-of-band portions of the other components. Decimation reduces the output sample rate to the Nyquist rate of $\phi(t)$. The result is a multi-bit digitized representation of $\phi(t)$.

It is the modulator loop that is the core of the $\Delta\Sigma$FDC. The remainder of this section will describe the basic $\Delta\Sigma$FDC modulator loop principle along with various preliminary results and simulations. First, three $\Delta\Sigma$FDC modulator loops that illustrate different aspects of the basic idea will be presented and analyzed in the absence of channel noise. Then, their behavior in the presence of channel noise will be discussed. Finally, the amenability of the structures to VLSI implementation will be considered.

Three Example Modulator Loops

Figure 1A:
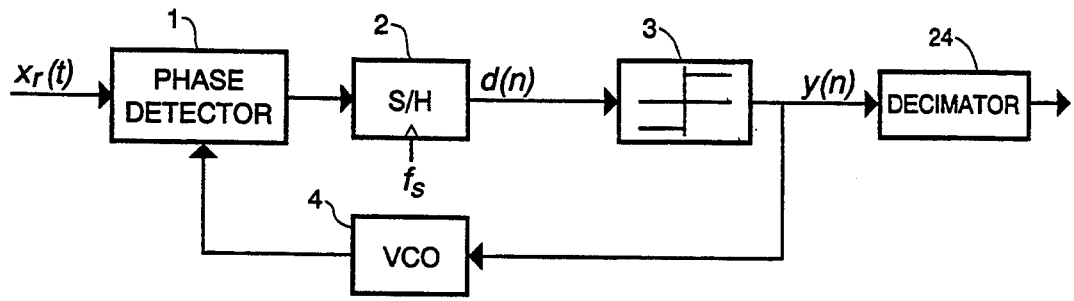
FIG. 1A is an example first-order ΔΣFDC modulator loop.
Figure 1B:
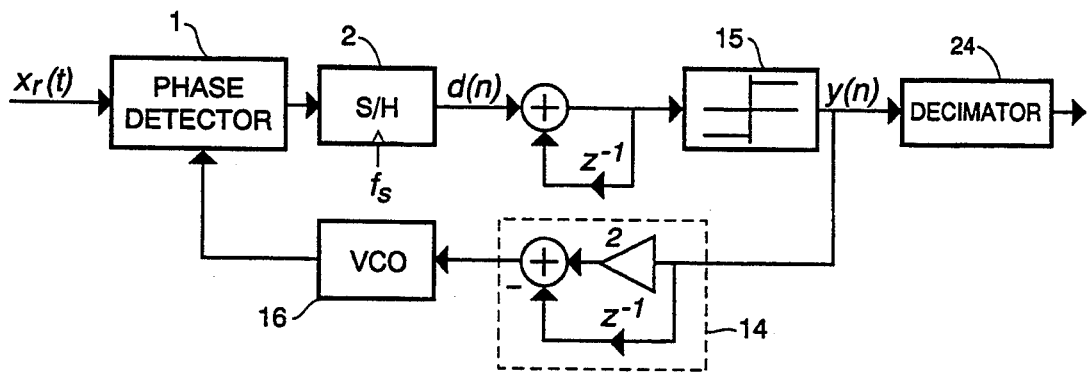
FIG. 1B is an example single-loop second-order ΔΣFDC modulator loop.
Figure 1C:
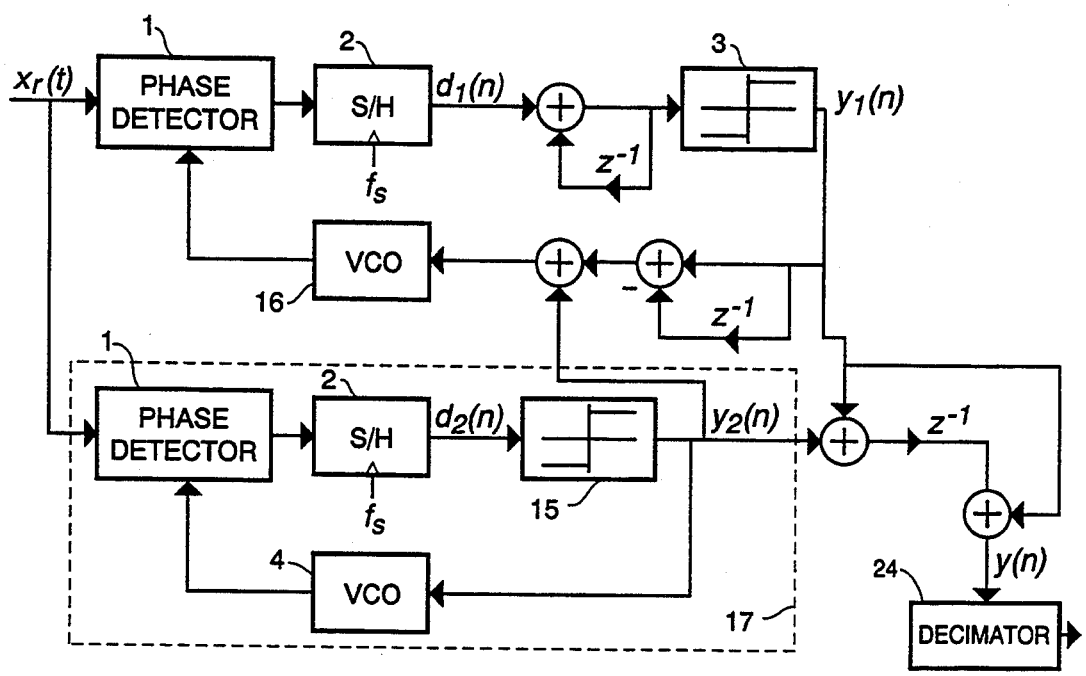
FIG. 1C is an example multistage second-order ΔΣFDC modulator loop.

The three example $\Delta\Sigma$FDC modulator loops to be discussed below are shown in FIGS. 1A, 1B and 1C. The structures each operate on $x_r(t)$ and produce a coarsely quantized sequence at sample rate $f_s$. By virtue of the sample-and-holds each modulator loop is composed of both continuous-time and discrete-time portions. In practice, signals following the sample-and-holds are still continuous-time signals except that they are only updated at the sample times. However, the following abuse of notation will be made. If it is convenient to refer to a sampled-and-held variable, say y(t), as the corresponding discrete-time sequence, it will be denoted as y(n) and should be interpreted as the value of y(t) just after the $n^{th}$ sample time.

In each of the modulator loops, the quantization is performed by one or more hard limiters. These are one-bit midrise quantizers that produce a positive one when their inputs are non-negative and a negative one otherwise. Multi-bit quantizers could also be used to perform the quantization. Each structure employs at least one phase detector and voltage controlled oscillator (VCO). For now it will suffice to assume that each phase detector produces a voltage equal to a positive constant, $K_p$, times the difference in phase of its two analog inputs (ignoring any amplitude modulation). Similarly, for now each VCO will be assumed to produce a continuous-phase sinusoid with instantaneous frequency equal to $f_c$ plus a positive constant, $K_v$, times its input voltage. Once the basic idea has been presented, the issues surrounding the use of practical phase detectors and VCOs will be discussed.

First-Order Modulator Loop Behavior

The simplest of the three modulator loops is the first-order structure shown in FIG. 1A. It consists of a phase detector 1, a sample-and-hold 2, a hard limiter 3, and a VCO 4. To understand how it operates, it is illustrative to first consider the following simple case. Suppose that $\phi(t)=\phi_0$ is a constant where $|\phi_0|<K_v$, and that n(t) is zero. Thus, $x_r(t)$ is a pure sinusoid of frequency $f_c+\phi_0$. At each sample time, the output of the sample-and-hold is updated with the difference between the phase of $x_r(t)$ and the phase of the VCO output. If at some sample time this value is positive, the output of the hard limiter will be a positive one and the instantaneous frequency of the VCO will be updated (if necessary) to $f_c-K_v$. Since $f_c-K_v<f_c+\phi_0$, at some time in the future the output of the phase detector must go negative. Provided the sample rate, $f_s$, is greater than $2K_v$, the output of the sample-and-hold will also eventually go negative and the instantaneous frequency of the VCO will be updated to $f_c+K_v$. Similarly, if at some sample time the output of the sample-and-hold is negative, the output of the hard limiter will be a negative one and the instantaneous frequency of the VCO will be updated (if necessary) to $f_c+K_v$. Again provided $f_s$ is greater than $2K_v$, the output of the sample-and-hold will eventually go positive because $f_c+K_v>f_c+\phi_0$. This argument is still valid if applied to sufficiently narrow-band angle modulated signals centered near $f_c$.

By this reasoning, it is evident that the first-order modulator loop "loosely" tracks the phase and frequency of the input signal. To prove that the first-order $\Delta\Sigma$FDC produces a high-precision digital conversion of $\phi(t)$ in the absence of channel noise, it remains to show that the spectrum of the output component corresponding to quantization error occupies predominantly high frequencies while the component corresponding $\phi(t)$ is not spectrally distorted. As discussed above, this allows the lowpass decimation filter to remove much of the quantization error without significantly distorting the component of the output corresponding to $\phi(t)$.

Figure 2A:
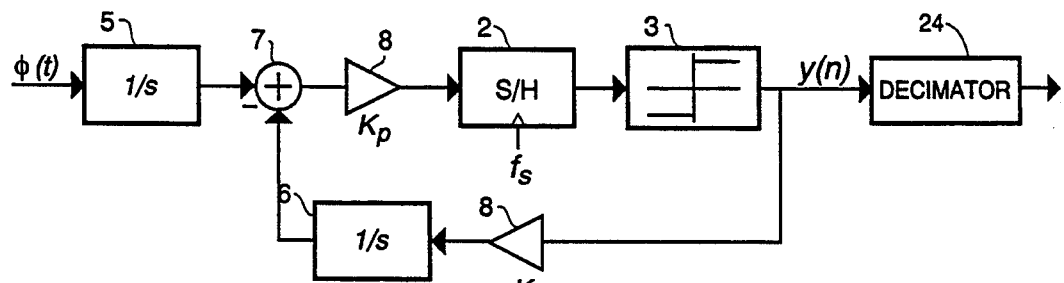
FIGS. 2A, 2B and 2C represents the analysis of the operation of the first-order modulator loop on the frequency modulation of $x_r(t)$.

The manner in which the first-order modulator loop processes $\phi(t)$ is shown in FIG. 2A. The integrator 5 following the input converts the frequency modulation term, $\phi(t)$, into an absolute phase. Similarly, the integrator 6 in the feedback loop converts the VCO frequency modulation into an absolute phase. The phase detector corresponds to the differencer 7 shown in the figure. The $K_v$ and $K_p$ scalar multipliers 8 arise from the VCO and phase detector gains, respectively.

Figure 2B:
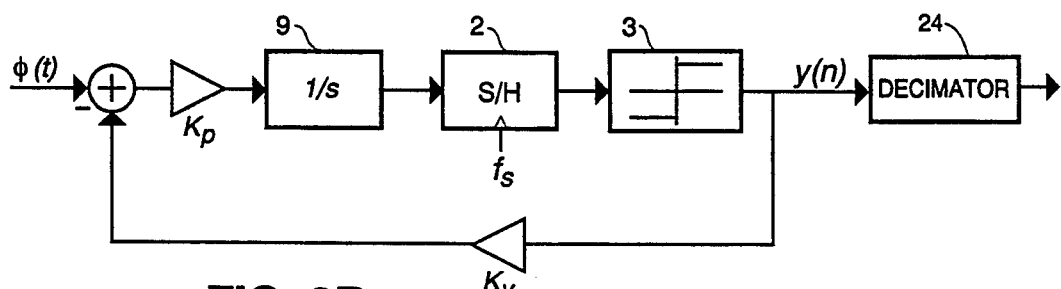

Because integration is linear, the two integrators 5 and 6 in FIG. 2A can be moved to the right of the phase detector and combined 9 without changing the system as shown in FIG. 2B. Just after the $n^{th}$ sample time, the output of the sample-and-hold must be $$d(n) = \int_{-\infty}^{nT_s} K_p [\phi(\tau) - K_v y(t)] d\tau,$$

where $T_s=1/f_s$ is the sampling interval. Since y(t) is a sampled-and-held signal, this equation can be rewritten as the difference equation:

$$d(n) = \sum_{i=-\infty}^{n} K_p[\hat{\phi}(i) - K_v T_s y(i-1)],$$

where $$\hat{\phi}(n) = \int_{(n-1)T_s}^{nT_s} \hat{\phi}(\tau)d\tau.$$

Figure 2C:
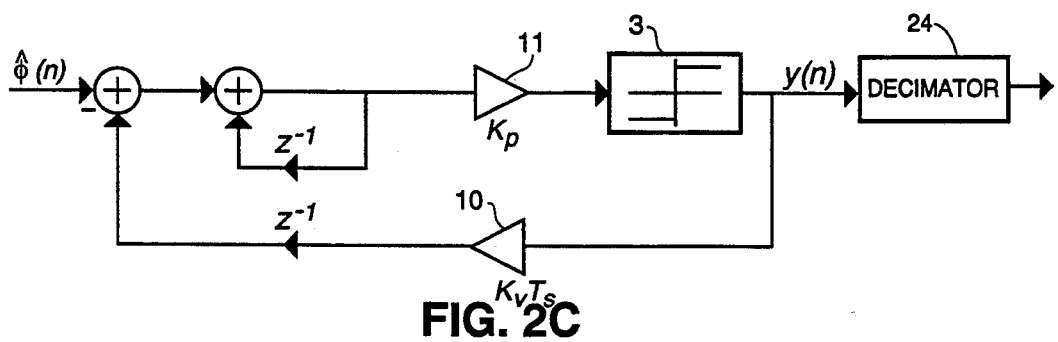

It follows that the system of FIG. 2B can be redrawn in a discrete-time form as shown in FIG. 2C. The two systems are equivalent in the sense that they produce the same output sequences. Moreover, because $f_s$ is much greater than the Nyquist ratio of $\phi(t)$, it follows that $\hat{\phi}(n) \approx \phi(nT_s)$ with a high degree of accuracy.

Note that aside from the $K_v T_s$ and $K_p$ gain elements 10 and 11, the system shown in FIG. 2C is simply a first-order $\Delta\Sigma$ modulator [1]. The $K_p$ gain element 11 has no effect on the behavior of the system because of the hard limiter, and it is easily verified that the $K_v T_s$ gain element 10 does not effect the quantization noise shaping behavior of the system. Accordingly, the first-order $\Delta\Sigma$FDC modulator loop operates on the frequency modulation of its input signal in the same manner that a first-order $\Delta\Sigma$ modulator operates on the amplitude of its input signal. With the definition that quantization noise, $\epsilon(n)$, is the difference between the output and input of the hard limiter at time n, a network analysis shows that the output of the modulator loop is $$y(n) = \frac{1}{K_v T_s} \hat{\phi}(n) + e(n),$$

where $e(n) = \epsilon(n) - \epsilon(n-1)$. The sequence $e(n)$ is the error at the output of the modulator loop due to the one-bit quantization performed by the hard limiter and is referred to as quantization error. The modulator loop thus subjects the quantization noise to the first-order highpass filter $1-z^{-1}$. As a result, the quantization error has zero DC power and tends to be weighted toward high frequencies.

It follows that the first-order $\Delta\Sigma$FDC performs oversampling A/D conversion on the frequency modulation term $\phi(t)$. The oversampling ratio is $f_s/f_N$, where $f_N$ is the Nyquist rate of $\phi(t)$. Existing $\Delta\Sigma$ modulator results indicate that the precision of the A/D conversion should increase by approximately 1.5 bits [4] for every doubling of the oversampling ratio. This result is supported by computer simulations.

Higher-Order Modulator Loops

Having established the analogy between the first-order $\Delta\Sigma$FDC modulator loop and the first-order $\Delta\Sigma$ modulator, the next logical step is to search for $\Delta\Sigma$FDC modulator loops analogous to higher order $\Delta\Sigma$ modulators. By subjecting the quantization noise to sharper highpass filtering such structures hold the promise of greater conversion accuracy at a given oversampling ratio. As mentioned above, higher order $\Delta\Sigma$FDC modulator loops can be found. For example, the modulator loops shown in FIG. 1B and FIG. 1C are analogous to second-order $\Delta\Sigma$ modulators in that they each subject their quantization noise to the second-order highpass filter $(1-z^{-1})^2$. However, before discussing these structures further, it is worth digressing to explain why the simplest method of generating a second-order $\Delta\Sigma$FDC modulator loop from the first-order loop does not lead to the most practical solution.

Figure 3:
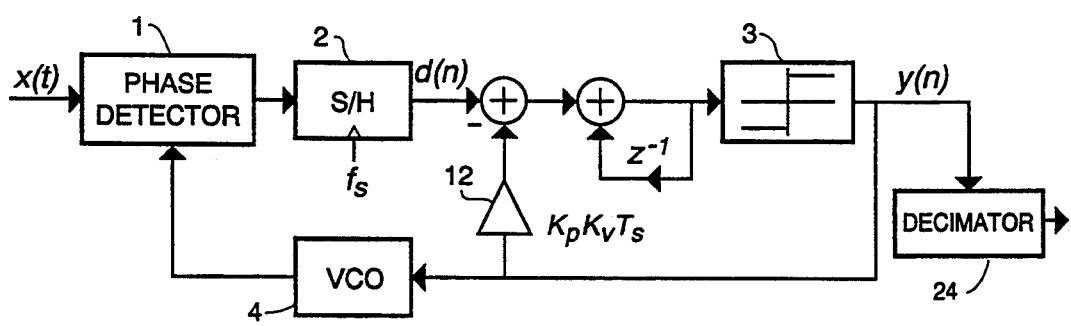
FIG. 3 is the simplest type of single-loop second-order ΔΣFDC modulator loop.

The simplest extension of the first-order $\Delta\Sigma$FDC modulator loop leading to a second-order structure is shown in FIG. 3. Just as in the case of the first-order modulator loop, the output of the sample-and-hold just after the $n^{th}$ sample time is $$d(n) = \sum_{i=-\infty}^{n} K_p[\hat{\phi}(i) - K_v T_s y(i-1)].$$

Figure 4:
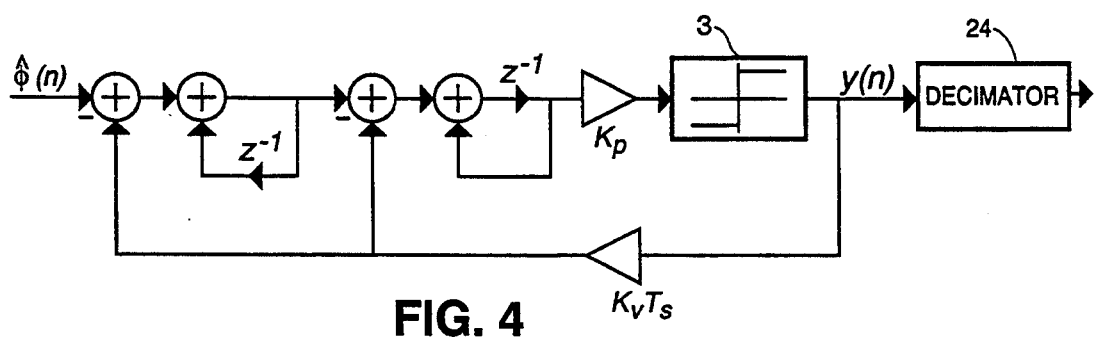
FIG. 4 shows the processing performed by the single-loop modulator loops of FIG. 1B and FIG. 3 on $\hat{\phi}(n)$.

It follows that the modulator loop operates on $\hat{\phi}(n)$ as the single-loop second-order $\Delta\Sigma$ modulator shown in FIG. 4. However, this conclusion relies on the gain element 12 in the second feedback path of the modulator loop being exactly equal to $K_p K_v T_s$. Unfortunately, the gain $K_p$, of most practical phase detectors is input-amplitude dependent [3]. The explicit $K_p$-dependent gain element therefore causes a significant practical problem; some sort of automatic gain control (AGC) of $x_r(t)$ would generally be required to maintain a constant phase detector gain.

This problem is avoided in the modulator loops of FIG. 1B and FIG. 1C. First consider the modulator loop shown in FIG. 1B. Following an analysis similar to that performed above for the first-order $\Delta\Sigma$FDC modulator loop, the output of this modulator loop's sample-and-hold just after the $n^{th}$ sample time is $$d(n) = \sum_{i=-\infty}^{n} K_p[\hat{\phi}(i) - K_v T_s(2y(i-1) - y(i-2))].$$

Drawing the system corresponding to this difference equation and rearranging things shows that like the modulator loop of FIG. 3 this modulator loop operates on $\hat{\phi}(n)$ as the single-loop second-order $\Delta\Sigma$ modulator of FIG. 4. However, unlike the modulator loop of FIG. 3, it does not contain an explicit $K_p$-dependent gain element. The idea involves the equivalent of both frequency and phase modulating the VCO output. In the modulator loop of FIG. 1B, the transfer function 14 between the hard limiter 15 and the VCO 16 is $2-z^{-1}$. Thus, the VCO is controlled by the sum of the hard limiter output, $y(n)$, and its digital derivative, $y(n)-y(n-1)$. The effect of the digital derivative is the modulate the phase of the VCO (as measured at each sample time) by $\pm K_p K_v T_s$. Thus the phase detector and VCO gains control the gain of both feedback paths in FIG. 4; any variation in phase detector gain affects both feedback paths equivalently, so the second-order quantization noise shaping property of the structure is preserved.

The modulator loop of FIG. 1C also performs second-order quantization noise shaping. To see this, proceed as above to find the output of the modulator loop's two sample-and-holds just after the $n^{th}$ sample time. These are $$d_1(n) =$$

$$\sum_{i=-\infty}^{n} K_p[\hat{\phi}(i) - K_v T_s(y_1(i-1) - y_1(i-2) + y_2(i-1))],$$

and $$d_2(n) = \sum_{i=-\infty}^{n} K_p[\hat{\phi}(i) - K_v T_s y_2(i-1)].$$

Figure 5:
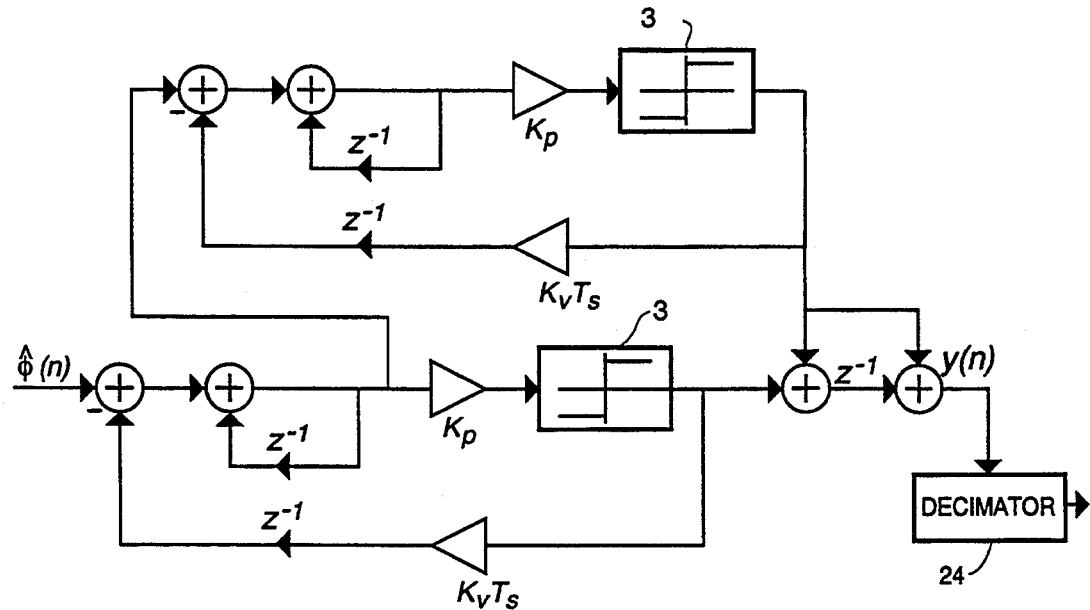
FIG. 5 shows the processing performed by the multistage second-order modulator loop of FIG. 1C on $\hat{\phi}(n)$.

The difference equations describe the system shown in FIG. 5 which is known to be a second-order multistage $\Delta\Sigma$ modulator [5].

The modulator loop uses the same frequency and phase modulation principle as the modulator loop of FIG. 1B so its quantization noise shaping property is not affected by variations in the phase detector gain. The lower modulator loop stage 17 shown in FIG. 1C controls the frequency modulation of both VCOs while the upper modulator loop only controls the phase modulation of its own VCO. Hence, the frequency tracking dynamics are controlled solely by the lower modulator loop. The main significance of the multistage modulator approach is that is offers a systematic method of generating yet higher-order modulator loops. For example, three first-order modulator loops can be combined to achieve a three-stage third-order modulator. Similarly, a second-order modulator loop can be combined with a first-order modulator loop to achieve a two-state third-order modulator loop.

As in the case of the first-order modulator loop, existing $\Delta\Sigma$ modulator theory can be brought to bear on the second-order modulator loops shown in FIG. 1B and FIG. 1C and on those created by cascading combinations of the first and second-order modulator loops. For example, for the second-order modulator loops existing $\Delta\Sigma$ modulator results indicate that the precision of the digital conversion should increase by approximately 2.5 bits [4] for every doubling of the oversampling ratio. Again, this result is supported by computer simulations.

The Effect of Channel Noise

Now consider the effect of random channel noise. There are two basic types of performance degradation that can arise from channel noise. The first arises because the channel noise generates a frequency modulation term of its own in $x_r(t)$ that the $\Delta\Sigma$FDC demodulates along with $\phi(t)$. This phenomenon is well known [6] and will not be discussed further since it affects all FM demodulators. The second arises from channel noise that passes to the output of the phase detector.

In the first-order modulator loop, such noise is injected just prior to the sample-and-hold 2, and is therefore sampled and subjected to the same first-order high-pass filter, $(1-z^{-1})$, seen by the quantization noise. Similar observations apply to the modulator loops of FIG. 1B and FIG. 1C. Therefore, like quantization error, this type of channel noise error will tend to be weighted toward high frequencies. However, the picture is more complicated. If the noise power is sufficiently high, the magnitude of the quantizer input can exceed the maximum magnitude of the quantizer output by more than half the quantization step size. This phenomenon is known as quantizer overload and results in performance degradation similar to that observed in $\Delta\Sigma$ modulators [4]. Moreover, high noise power levels can cause cycle slipping wherein the difference between the phase of $x_r(t)$ and the VCO slips by one or more cycles in either direction. Both quantizer overload and cycle slipping can severely degrade performance if their frequency of occurrence is high. Nevertheless, simulations, some of which are discussed below, indicate that the $\Delta\Sigma$FDC is quite robust with respect to channel noise.

Practical Phase Detectors and VCOs

The discussion thus far has only considered modulator loops with ideal phase detectors and VCOs. A variety of practical phase detectors and VCOs capable of operating over an extremely wide range of frequencies exit and their characteristics are well understood [7]. Clearly the specifics of the phase detector must be considered in any meaningful channel noise analysis. $\Delta\Sigma$ modulators have been observed to be robust with respect to non-ideal circuit behavior [1], and because of their relationship to $\Delta\Sigma$ modulators it follows that $\Delta\Sigma$FDCs are similarly robust. For example, in the first-order $\Delta\Sigma$FDC modulator loop, it is not necessary for the phase detector to be linear or to have a constant gain because it is followed by the hard limiter.

An advantage of the invention relates to its amenability to VLSI implementation. Aside from the phase detector and VCO, the components that make up the $\Delta\Sigma$FDC modulator loops are the same as those used in $\Delta\Sigma$ modulators. As such, many of the VLSI design issues are similar and have been studied extensively. One approach is therefore to integrate all of the $\Delta\Sigma$FDC on a single mixed-mode CMOS VLSI integrated circuit except for the phase detector and VCO which would be implemented separately using higher-precision and possibly higher-frequency bipolar or GaAs processes. Since a multitude of phase detector and VCO circuits are widely available, well understood, and relatively inexpensive, this is a reasonable approach.

On the other hand, integrating the entire $\Delta\Sigma$FDC on a single low-cost mixed-mode VLSI integrated circuit offers the potential of increased reliability and decreased cost. However, because of the analog limitations imposed by fine-line VLSI processes, the appropriate selection of the phase detector and VCO are critical. One possibility is to use sampling phase detectors [3]. FIG. 6 shows modified versions of the three modulator loops of FIG. 1 using such phase detectors that are well suited to VLSI implementation. The phase detectors are implemented as one-bit A/D converters (voltage comparators) 18 and instead of VCOs the systems use all-digital number controlled oscillators (NCOs) 19.

Figure 6A:
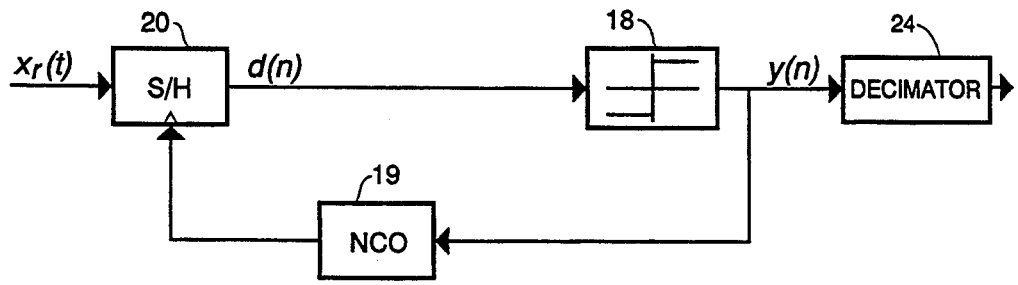
FIGS. 6A, 6B and 6C illustrate modified versions of the modulator loops shown in FIGS. 1A, 1B and 1C that employ sampling phase detectors and all-digital number controlled oscillators (NCOs).
Figure 6B:
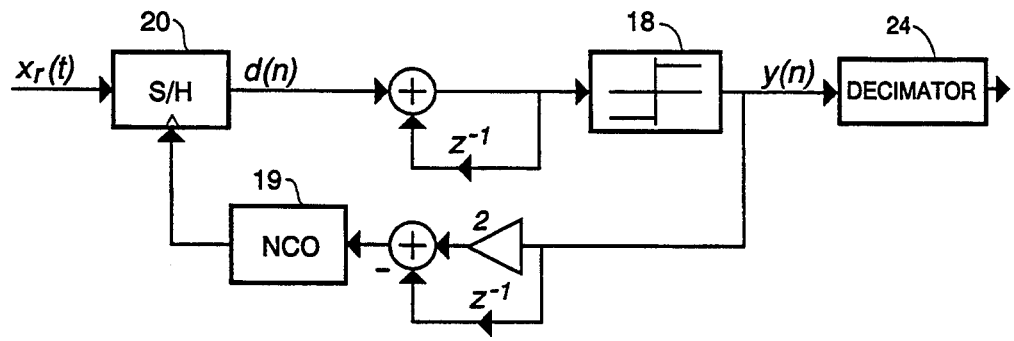
Figure 6C:
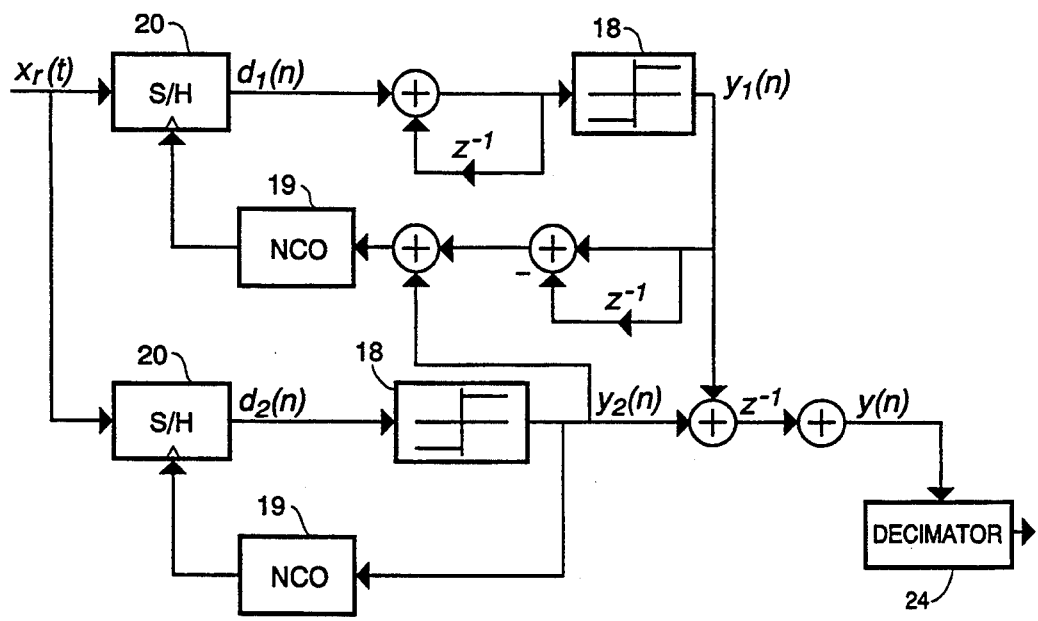

Consider the first-order modulator loop of FIG. 6a. The system is simply a one-bit A/D converter 18 and an NCO 19 enclosed in a feedback loop. The A/D converter performs mid-rise quantization on the analog input signal; if the input signal is positive at a given sampling instant, the A/D converter outputs the equivalent of a one. Otherwise it outputs the equivalent of a negative one. The NCO generates the sampling clock for the A/D converter. It functions as a variable-length counter that generates pulses spaced at either N or N+1 periods of a master clock where N is some fixed positive integer. If the output of the A/D converter is one, the NCO waits N periods of the master clock before producing the next pulse. Otherwise, it waits N+1 periods. With the master clock frequency denoted as $f_m$, its period denoted as $T_m = 1/f_m$, and the sequence of sample times denoted as $\{\tau_n\}$, each sample time is chosen as $$\tau_n = \begin{cases} \tau_{n-1} + NT_m, & \text{if } x(\tau_{n-1}) > 0; \\ \tau_{n-1} + (N+1)T_m, & \text{if } x(\tau_{n-1}) < 0. \end{cases}$$

Each of the modulator loops loosely tracks the zero crossings of $x_r(t)$. The scheme requires that $f_m$ and N be chosen such that $f_m/(N+1) < f_c < f_m/N$. When the phase of the NCO output leads that of the input signal, the A/D converter outputs a minus one. Similarly, when the phase of the NCO output lags that of the input signal, the A/D converter outputs a one. Therefore, the A/D converter acts as a phase detector followed by a hard limiter. By defining $$\hat{\phi}(n) = \int_{\tau_{n-1}}^{\tau_n} \phi(t)dt,$$

and performing analyses similar to those performed above for the modulator loops of FIG. 1, it is easy to show that the modulator loops of FIG. 6 operate on $\hat{\phi}(n)$ as first-order, single-loop second-order, and multi-stage second-order $\Delta\Sigma$ modulators, respectively.

There are two primary drawbacks to the modulator loops of FIG. 6. The first is that the master clock must run approximately N (typically $10 \leq N \leq 100$) times faster than the carrier frequency of $x_r(t)$, and the second is that some distortion is caused by the non-uniform sampling and integration interval of $\phi(t)$. For very narrow-band $\phi(t)$, a potential solution is to have the output of the NCO be one of two (or possibly more) phase-locked clock signals separated in frequency by $2 K_\nu$ Hz. The NCO would again drive a sampler, but the samples would be integrated for a period of $1/(2 K_\nu)$ and then re-sampled at the modulator loop sample rate $f_s = 2 K_\nu$. Such a system would be useful in radio frequency (RF) tone tracking and would be amenable to GaAs VLSI implementation.

Simulation Results

Figure 7:
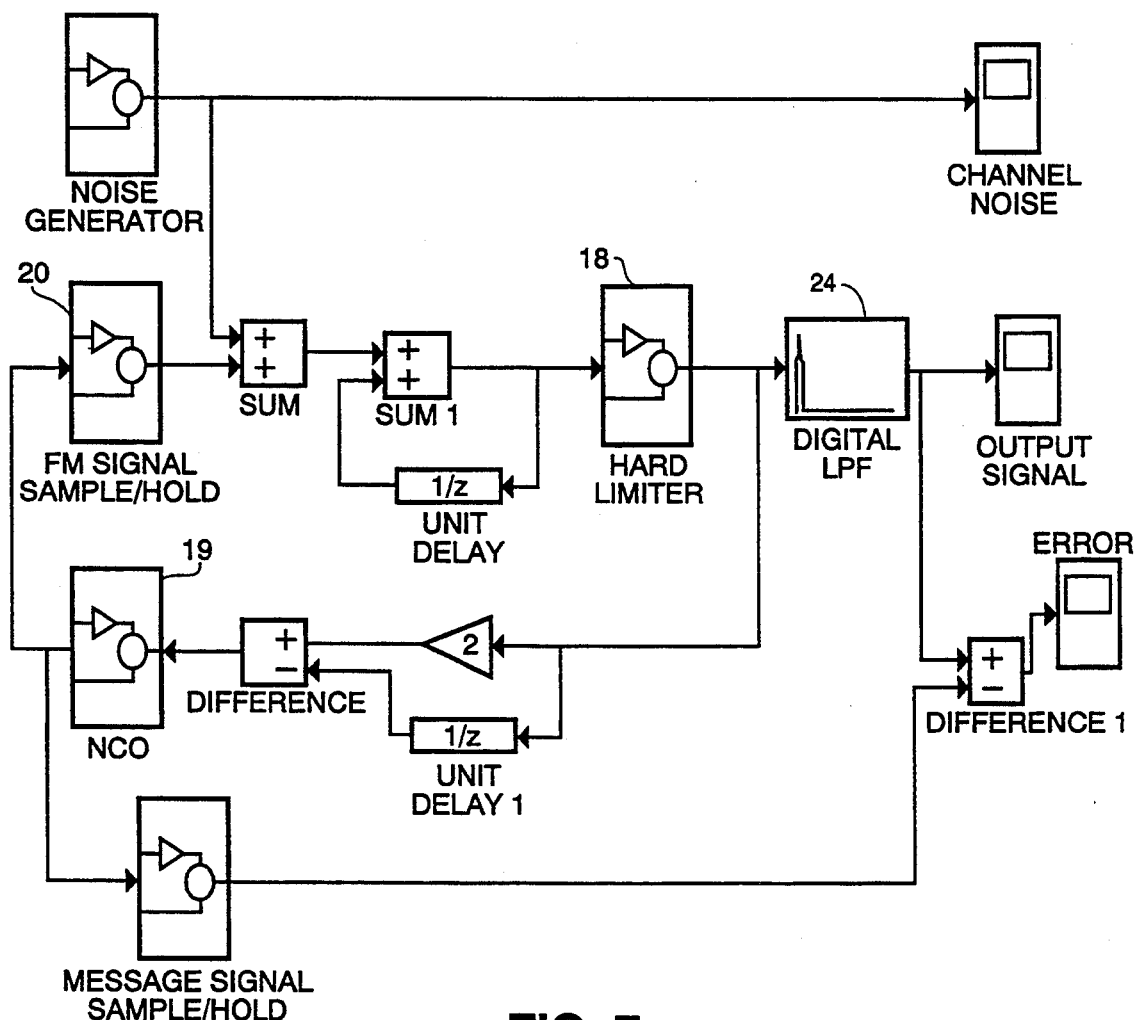
FIG. 7 shows a Mathworks Simulink implementation modular of the loop in FIG. 6B.
Figure 8:
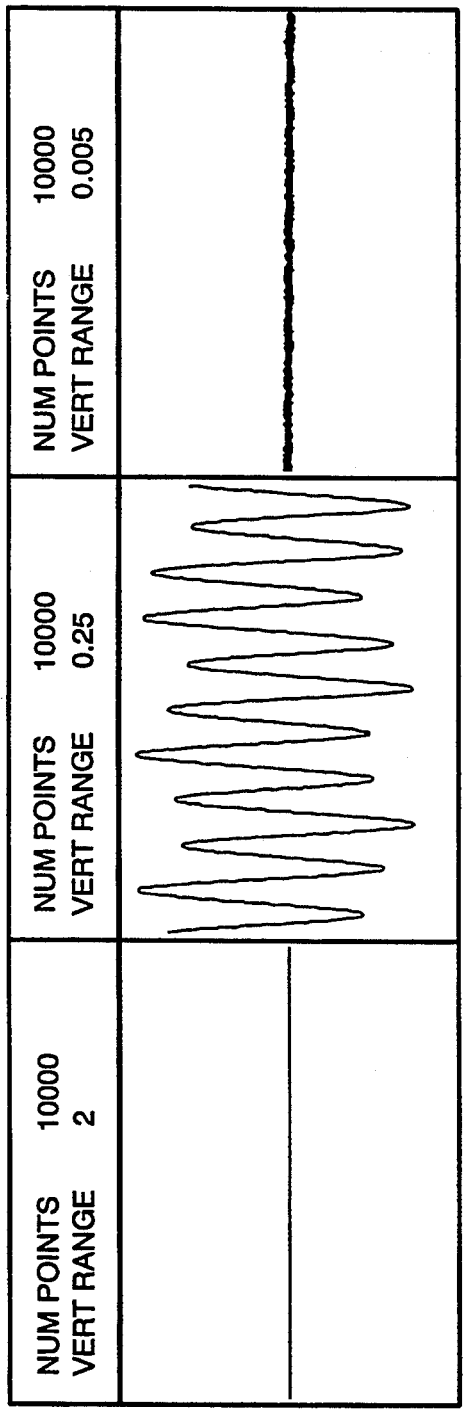
FIGS. 8, 9 and 10 show the results of the simulation in FIG. 7 for the no channel noise, 9 dB signal to channel noise ratio, and 3 dB signal to channel noise ratio cases.
Figure 9:
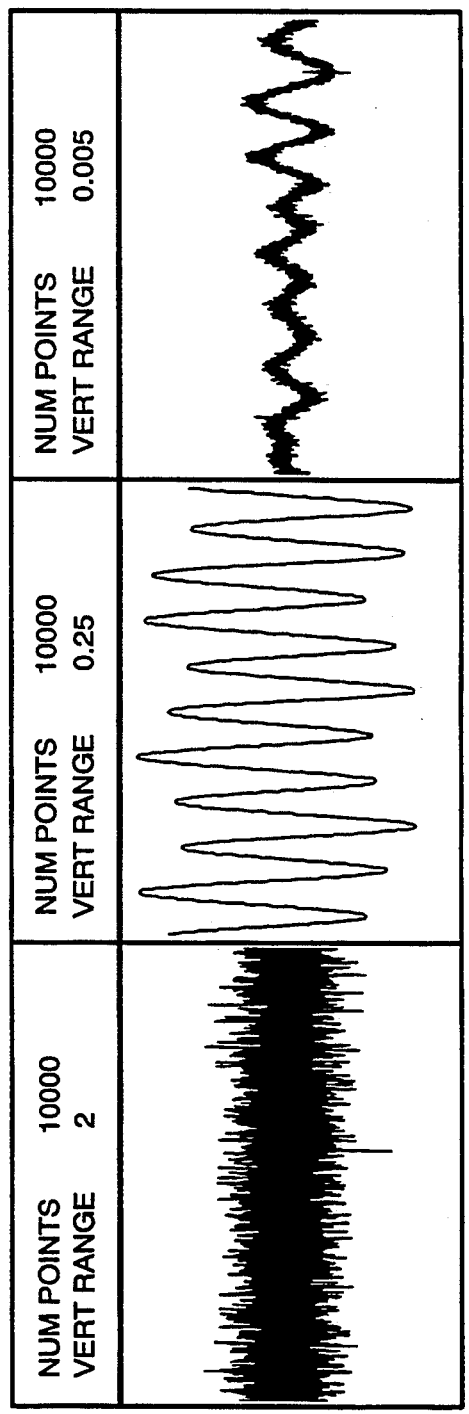
Figure 10:
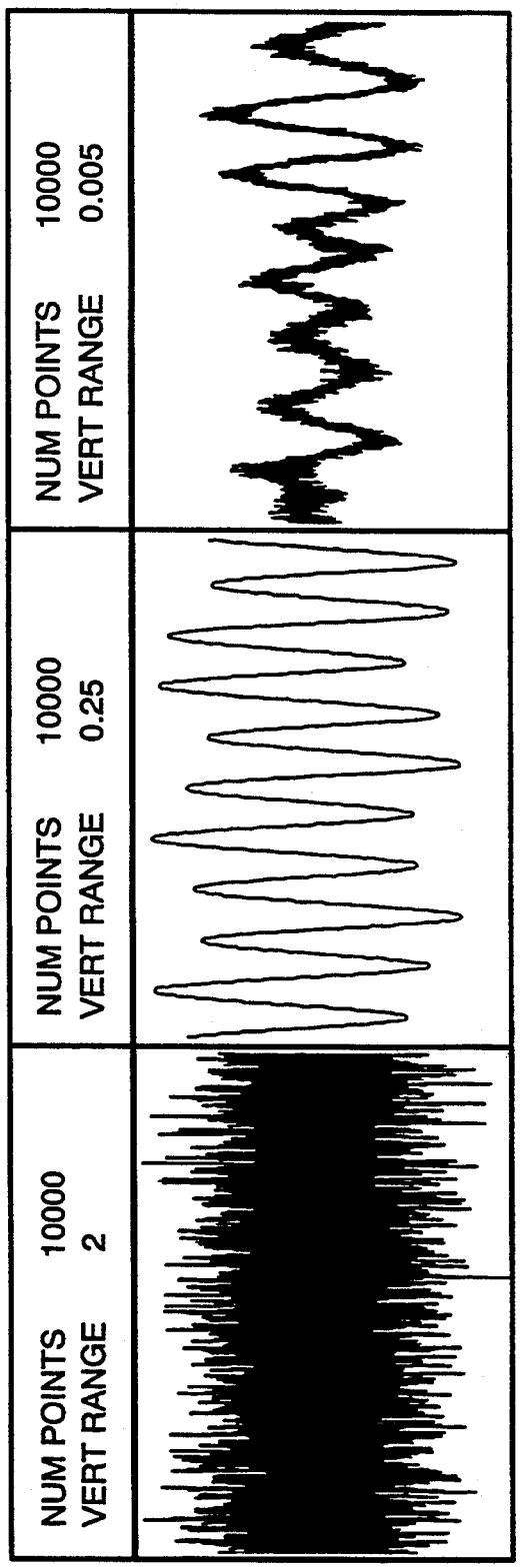

Simulation results indicate that these modulator loops perform well in the presence of channel noise. For example, FIG. 7 shows a Mathworks Simulink implementation of a $\Delta\Sigma$FDC based on the second-order modulator loop of FIG. 6b. Three simulations were performed with $$\phi(t) = (0.00024\pi f_c) \cos(0.006\pi f_c t) - (0.0012\pi f_c) \sin(0.002\pi f_c t),$$

an average sample rate of $f_c$, N=25, and a digital filter cutoff frequency of $0.0023\pi$. FIG. 8 shows the results for the case of no channel noise, and FIGS. 9 and 10 show the results for white Gaussian channel noise with input signal-to-noise ratios (SNRs) of 9 dB and 3 dB, respectively. In each case the input channel noise is shown on a vertical scale of $\pm 2$, the $\Delta\Sigma$FDC output is shown on a vertical scale of $\pm 0.25$, and the error (the difference between the $\Delta\Sigma$FDC output and $\hat{\phi}(n)$) is shown on a vertical scale of $\pm 0.005$. Aside from a scale factor the same channel noise sequences were used in the latter two simulations.

As is evident from the figures, this particular $\Delta\Sigma$FDC appears to perform well even for small input SNRs. In the absence of channel noise, the error plot is a result of quantization error alone, and the error power level is consistent with that expected for the corresponding second-order $\Delta\Sigma$ modulator [4]. As mentioned above, separate simulations have been performed by the Inventor that quantitatively support this conclusion. In the cases of 9 dB and 3 dB input SNR, the error plot contains components corresponding to quantization error and channel noise. In these cases, the error level is still seen to be small relative to output signal. The similarity between the error plots in the two cases is interesting and may indicate that much of the error arises from the frequency modulation imposed on $x_r(t)$ by the channel noise as discussed above. Numerous similar simulation runs for each of the modulator loops of FIG. 6 with various input signals, channel noise levels, and loop parameters have been performed and also support the results outlined above.

Although particular embodiments of the invention have been described and illustrated herein, it is recognized that modifications and variations may readily occur to those skilled in the art. The preceeding descriptions of the invention are thus illustrative only. The invention is limited only as required by the following claims and equivalents thereto.

What is claimed is:

1. A frequency-to-digital converter that operates on an input signal and generates a digital output signal at an output sample-rate, f, comprising:
   a modulator loop means for generating a coarsely quantized digital representation of the frequency modulation of said input signal at a modulator loop sample-rate of Nf where N is a positive number, wherein the component of said digital output signal corresponding to quantization error has a spectrum that occupies primarily high frequencies; and,
   a decimation filter coupled to said modulator loop means, said decimation filter for providing lowpass digital filtering and for reducing the modulator loop sample rate, Nf, to said output sample rate f.

2. The frequency-to-digital converter of claim 1 wherein said modulator loop means comprises:
   a phase detector with a first and second input, said first input being coupled to said input signal, said phase detector for generating an output signal that depends on the difference in phase of said input signal and any signal applied to said second input of said phase detector;
   a sample-and-hold circuit coupled to said phase detector for sampling and holding data received from said phase detector;
   a quantizer coupled to said sample-and-hold circuit for performing coarse quantization on each value sampled and held by said sample-and-hold circuit; and
   a controlled oscillator coupled to said quantizer for generating an output signal with an instantaneous frequency that varies in proportion to the output of said quantizer, said controlled oscillator having an output coupled to said second input of said phase detector that is not coupled to said input signal,
   so that a feedforward path is comprised of said phase detector, said sample-and-hold circuit, and said quantizer, and a feedback path is comprised of said controlled oscillator from said quantizer to said second of the inputs of said phase detector.

3. The frequency-to-digital converter of claim 2 wherein said phase detector is a multiplier-type phase detector.

4. The frequency-to-digital converter of claim 2 wherein said phase detector and sample-and-hold circuit are combined to provide means for sampling phase detection, wherein said output of said controlled oscillator determines when said input signal is sampled by said means for sampling phase detection.

5. The frequency-to-digital converter of claim 2 wherein said modulator loop means further comprises:
first means for discrete-time filtering in the feedforward path having an input coupled to said sample-and-hold circuit and an output coupled to said quantizer; and
second means for discrete-time filtering in the feedback path having an input coupled to the output of said quantizer and having an output coupled to said controlled oscillator,
so that said feedforward path is comprised of said phase detector, said sample-and-hold circuit, said first means for discrete-time filtering, and said quantizer; and said feedback path is comprised of said second means for discrete-time filtering and said controlled oscillator coupled from the output of said quantizer to said second input of said phase detector.

6. The frequency-to-digital converter of claim 5 wherein said first means for discrete-time filtering in the feedforward path has a transfer function $1/(1-z^{-1})$ and said second means for discrete-time filtering in the feedback path has a transfer function $(2-z^{-1})$.

7. The frequency-to-digital converter of claim 1 wherein said modulator loop comprises two interconnected modulator loop stages:
a first-stage modulator loop operating on said input signal and generating an output signal $y_2(n)$, said first-stage modulator loop comprised of:
 a first phase detector with a first and second input, said first input being coupled to said input signal, said first phase detector for generating an output signal that depends on the difference in phase of said input signal and any signal applied to said second input of said first phase detector;
 a first sample-and-hold circuit coupled to said first phase detector for sampling and holding data received from said first phase detector;
 a first quantizer coupled to said first sample-and-hold circuit for performing coarse quantization on each value sampled and held by said first sample-and-hold circuit; and
 a first controlled oscillator coupled to said first quantizer for generating an output signal with an instantaneous frequency that varies in proportion to the output of said first quantizer, said first controlled oscillator having an output coupled to said second input of said first phase detector that is not coupled to said input signal,
so that a first feedforward path is comprised of said first phase detector, said first sample-and-hold circuit, and said first quantizer, and a feedback path is comprised of said first controlled oscillator from said first quantizer to one of the inputs of said first phase detector;
a second-stage modulator loop operating on said input signal and generating an output signal $y_1(n)$, said second-stage modulator loop comprised of:
 a second phase detector with a first and second input, said first input being coupled to said input signal, said second phase detector for generating an output signal that depends on the difference in phase of the input signal and any signal applied to said second input of said second phase detector;
 a second sample-and-hold circuit coupled to said second phase detector for sampling and holding data received from said second phase detector;
 first means for discrete-time filtering with transfer function $1/(1-z^{-1})$ coupled to said second sample-and-hold circuit; and
 a second quantizer coupled to said means for discrete-time filtering with transfer function $1/(1-z^{-1})$ for performing coarse quantization of output from said means for filtering with transfer function $1/(1-z^{-1})$;
second means for performing discrete-time filtering with transfer function $1/(1-z^{-1})$ having an input coupled to the output of said second quantizer;
means for adding said output signal $y_2(n)$ from said first-stage modulator loop to the output of said second means for performing digital filtering with transfer function $1/(1-z^{-1})$; and
a second controlled oscillator coupled to said means for adding, said second oscillator for generating a signal with an instantaneous frequency that varies in proportion to the output of said means of adding, said second controlled oscillator having an output coupled to said second input of said second phase detector that is not coupled to said input signal,
so that a second feedforward path is comprised of said second phase detector, said second sample-and-hold circuit, said first means for discrete-time filtering with transfer function $1/(1-z^{-1})$, and said second quantizer, and a second feedback path is comprised of said second controlled oscillator, said second means for discrete-time filtering with transfer function $(1-z^{-1})$, and said means for adding said output signal $y_2(n)$ from said first-stage modulator loop to the output of said second means for performing digital filtering with transfer function $(1-z^{-1})$; and
a means coupled to said first and second quantizers of said first-stage and second-stage modulator loops for generating the overall output signal $y(n)=y_1(n)+y_2(n-1)+y_1(n-1)$.

8. The frequency-to-digital converter in claim 1 wherein said modulator loop means comprises:
a sampling phase detector coupled to the input signal, said sampling phase detector for generating a sampled output signal that depends on the difference in phase of said input signal and a signal coupled to a sampling signal input of said sampling phase detector;
a quantizer coupled to said sampling phase detector for performing coarse quantization on each value output from said sampling phase detector and for generating a quantized output; and
a number controlled oscillator coupled to said quantizer for generating an output signal with an instantaneous frequency that varies in proportion to said quantized output of said quantizer, said number controlled oscillator output coupled to said sampling signal input of said sampling phase detector,
so that a feedforward path is comprised of said sampling phase detector, and said quantizer, and a feedback path is comprised of said number controlled oscillator from said quantizer to said sampling signal input of said phase detector.

9. The frequency-to-digital converter of claim 8 wherein said modular loop means further comprises:
first means for discrete-time filtering in the feedforward path having an input coupled to said sampling phase detector and an output coupled to said quantizer; and
second means for discrete-time filtering in the feedback path having an input coupled to the output of said quantizer and having an output coupled to said number controlled oscillator.

10. The frequency-to-digital converter of claim 9 wherein said first means for discrete-time filtering in the feedforward path has a transfer function $1/(1-z^{-1})$ and said second means for discrete-time filtering in the feedback path has transfer function $(2-z^{-1})$.

11. The frequency-to-digital converter of claim 1 wherein said modulator loop comprises two interconnected modulator loop stages:
a first-stage modulator loop operating on said input signal and generating an output signal $y_2(n)$, said first-stage modulator loop comprised of:
a first sampling phase detector coupled to said input signal, said first sampling phase detector for generating a sampled output signal that depends on the difference in phase of said input signal and a signal at a sampling signal input of said first sampling phase detector;
a first quantizer coupled to said first sampling phase detector for performing coarse quantization on each value of said sampled output signal of said first sampling phase detector and for generating a quantized output; and
a first number controlled oscillator coupled to said first quantizer for generating a signal with an instantaneous frequency that varies in proportion to said quantized output of said first quantizer, said first number controlled oscillator having an output coupled to said sampling signal input of said first sampling phase detector,
so that a first feedforward path is comprised of said first sampling phase detector, and said first quantizer, and a feedback path is comprised of said first number controlled oscillator from said first quantizer to said sampling signal input of said first sampling phase detector;
a second-stage modulator loop operating on said input signal and generating an output signal $y_1(n)$, said second-stage modulator loop comprised of:
a second sampling phase detector with a first and second input, said first input being coupled to said input signal, said second sampling phase detector for generating a sampled output signal that depends on the difference in phase of said input signal and a signal at said second input of said second sampling phase detector, said second input being a sampling signal input;
means for discrete-time filtering said sampled output signal with transfer function $1/(1-z^{-1})$, said means for discrete-time filtering coupled to said second sampling phase detector; and
a second quantizer coupled to said means for discrete-time filtering with transfer function $1/(1-z^{-1})$ for performing coarse quantization of an output from said means for filtering with transfer function $1/(1-z^{-1})$;
means for adding said output signal $y_2(n)$ from said first-stage modulator loop to said output of said means for discrete-time filtering with transfer function $1/(1-z^{-1})$; and
a second number controlled oscillator coupled to said means for adding, said second number controlled oscillator for generating a signal with an instantaneous frequency that varies in proportion to the output of said means for adding, said second number controlled oscillator having an output coupled to said sampling signal input of said second phase detector,
so that a second feedforward path is comprised of said second sampling phase detector, said means for discrete-time filtering with transfer function $1/(1-z^{-1})$, and said second quantizer, and a second feedback path is comprised of said second number controlled oscillator, said means for discrete-time filtering with transfer function $(1-z^{-1})$, and said means for adding said output signal $y_2(n)$ output from said first-stage modulator loop to the output of said means for performing discrete-time filtering with transfer function $(1-z^{-1})$; and
a means coupled to said first and second quantizers of said first-stage and second-stage modulator loops for generating an overall output signal $y(n) = y_1(n-)+y_2(n-1)+y_1(n-1)$.

12. A method of operating on an input signal of the form:

$$x_r(t) = A\cos\left(2\pi f_c t + 2\pi \int_{-\infty}^{t} \phi(\tau)d\tau\right) + n(t)$$

where A is a constant amplitude, fc is a constant carrier frequency, $\phi(t)$ is a frequency modulation signal, and n(t) is undesired noise; and producing a digital representation of $\phi(t)$; comprising the steps of:
generating a quantized digital representation of $\phi(t)$ with a sample rate greater than the Nyquist rate of $\phi(t)$, said quantized digital representation of $\phi(t)$ having an error associated therewith, wherein said error is predominantly at high frequencies; and
lowpass filtering and reducing said sample rate of said quantized digital representation of $\phi(t)$ by providing lowpass digital decimation filtering;
where said step of generating comprises the steps of:
performing phase measurements of $x_r(t)$ relative to a feedback signal;
performing quantization on data generated from said phase measurements; and
generating said feedback signal using data from said step of quantization.

13. The method of claim 12 wherein the step of generating comprises the steps of:
sampling and holding data received from said step of performing phase measurements of $x_r(t)$;
performing coarse quantization on data from said step of sampling and holding data; and
generating said feedback signal with an instantaneous frequency that varies in proportion to quantized data from said step of coarsely quantizing.

14. The method of claim 13 wherein said step of generating further comprises the steps of:
discrete-time filtering of sampled-date prior to said step of quantization; and performing discrete-time filtering prior to said step of generating said feedback signal.

15. A frequency-to-digital converter for processing a frequency modulated input signal and generating a digital signal representing the frequency modulation of the input signal at an output sample-rate, f, comprising:

a plurality of modulator loop means each having an input and an output and a feedforward path and a feedback path, wherein each modulator loop means generates a coarsely quantized digital representation of the frequency modulation of said input signal with a sample-rate greater than said output sample-rate, f, and the component of said digital output signal corresponding to quantization error has a spectrum that occupies primarily high frequencies;

means for coupling said feedforward path of one of said plurality of modulator loop means to said feedback path of another one of said plurality of modulator loop means;

means for coupling said outputs of said plurality of modulator loop means together according to a predetermined functional relationship between said outputs of said plurality of modulator loop means; and a decimation filter coupled to said commonly coupled outputs, said decimation filter for providing lowpass digital filtering and for reducing the sample-rate of said digital outputs of the modulator loops to said output rate f.

16. The frequency-to-digital converter of claim 15 wherein one of said plurality of modulator loop means comprises:

a phase detector;

a sample-and-hold circuit coupled to said phase detector for sampling and holding data received from said phase detector;

a quantizer coupled to said sample-and-hold circuit for performing coarse quantization of data sampled and held by said sample-and-hold circuit and generating a quantized output; and a controlled oscillator coupled to said quantizer for generating a signal with an instantaneous frequency that varies in proportion to said quantized output of said quantizer, said controlled oscillator having an output coupled to said phase detector;

so that a feedforward path is comprised of said phase detector, said sample-and-hold circuit, and quantizer, and a feedback path is comprised of said oscillator from said quantizer to one input of said phase detector.

17. The frequency-to-digital converter of claim 16 wherein said one modulator loop means further comprises:

means for discrete-time filtering of sampled-data having input coupled to said sample-and-hold circuit and an output coupled to said quantizer; and means for performing digital filtering having an input coupled to the output of said quantizer and having an output coupled to said controlled oscillator.

18. A method of frequency-to-digital conversion of a frequency modulated input signal at an output frequency rate of f comprising the steps of:

generating a coarsely quantized digital signal representing the frequency modulation of said input signal in a plurality of modulator loop circuits, each modulator loop circuit having an input and an output, said coarsely quantized digital signal being generated at a sample rate greater than said output frequency rate of f so that said digital signal has a component corresponding to quantization error with a spectrum which occupies primarily high frequencies;

coupling a feedforward signal from one of said plurality of modulator loop circuits to be used as a feedback signal in another one of said plurality of modulator loop circuits;

combining output signals from each of said plurality of modulator loop circuits together according to a predetermined functional relationship between said outputs of said plurality of modulator loop circuits; and decimation filtering to said commonly coupled outputs to provide lowpass digital filtering and to reduce said sample rate of said digital output of said modulator loop circuits to said output rate f.

19. The method of claim 18 where said step of generating comprises the steps of:

phase detecting said frequency modulated input signal to generate phase detected data;

sampling and holding said phase detected data;

coarsely quantizing said sampled and held phase detected data;

generating a signal with an instantaneous frequency that varies in proportion to coarsely quantized data from said step of coarsely quantizing; and controlling said step of phase detecting with said periodic signal.

20. The method of claim 19 where said step of generating further comprises the steps of:

discrete time filtering said sampled and held phase detected data prior to said step of coarsely quantizing; and digitally filtering said coarsely quantized data.

21. The said method of claim 18 where said step of generating comprises the steps of:

detecting said frequency modulated input signal to generate sampled data;

coarsely quantizing said sampled data;

generating a signal with an instantaneous frequency that varies in proportion to coarsely quantized sample data from said step of coarsely quantizing; and controlling said step of detecting with said periodic signal.

22. The method of claim 21 where said step of generating further comprises the steps of:

discrete time filtering said sampled data prior to said step of coarsely quantizing; and digitally filtering said coarsely quantized data.

* * * * *